United States Patent
Leon (10) Patent No.: US 9,380,713 B2
(45) Date of Patent: Jun. 28, 2016

(54) VARIABLE SPEED DRIVE AND SYSTEM INCLUDING AN ARCHITECTURE FOR REINFORCING THE INGRESS PROTECTION OF THE VARIABLE SPEED DRIVE

(71) Applicant: Schneider Toshiba Inverter Europe SAS, Pacy sur Eure (FR)

(72) Inventor: Frederic Leon, Marcilly sur Eure (FR)

(73) Assignee: SCHNEIDER TOSHIBA INVERTER EUROPE SAS, Parcy sur Eure (FR)

(*) Notice: Subject to any disclaimer, the term of this patent is extended or adjusted under 35 U.S.C. 154(b) by 301 days.

(21) Appl. No.: 14/041,444

(22) Filed: Sep. 30, 2013

(65) Prior Publication Data

US 2014/0146449 A1 May 29, 2014

(30) Foreign Application Priority Data

Nov. 26, 2012 (FR) .................................... 12 61244

(51) Int. Cl.
*H05K 5/00* (2006.01)
*H05K 7/14* (2006.01)

(52) U.S. Cl.
CPC ............ *H05K 5/0004* (2013.01); *H05K 7/1432* (2013.01)

(58) Field of Classification Search
CPC . H05K 5/0091; H05K 5/0004; H05K 7/1432; G06F 1/1656
USPC ........................................ 361/679.01, 679.02
See application file for complete search history.

(56) References Cited

U.S. PATENT DOCUMENTS

| 8,456,840 B1* | 6/2013 | Clidaras ............ H05K 7/20745 165/104.22 |
| 2001/0036098 A1 | 11/2001 | Larikka |
| 2012/0249031 A1 | 10/2012 | Leon |

FOREIGN PATENT DOCUMENTS

| DE | 10 2008 034 417 A1 | 10/2009 |
| EP | 1 150 555 A2 | 10/2001 |
| EP | 2 509 402 A1 | 10/2012 |
| FR | 2 947 692 A1 | 1/2011 |

OTHER PUBLICATIONS

French Preliminary Search Report with written opinion issued Jul. 22, 2013 in French 12 61244, filed on Nov. 26, 2012 ( with English Translation of Category of Cited Documents).

* cited by examiner

*Primary Examiner* — Anthony Haughton
*Assistant Examiner* — Ingrid Wright
(74) *Attorney, Agent, or Firm* — Oblon, McClelland, Maier & Neustadt, L.L.P.

(57) ABSTRACT

The invention relates to a variable speed drive (1) intended to control an electrical load, said variable speed drive (1) being constructed to be inserted along a main axis (X) through an opening (200) produced in a frame (2). The variable speed drive has the particular feature of comprising an undercut (40) produced on its rear part and having a sufficient depth to allow its fixing plinth (111) to pass through said opening (200). The invention also relates to a system comprising the variable speed drive and a seal-tight architecture. The seal-tight architecture comprises said frame through which the opening (200) intended to accommodate the variable speed drive (1) is produced.

10 Claims, 7 Drawing Sheets

VARIABLE SPEED DRIVE AND SYSTEM INCLUDING AN ARCHITECTURE FOR REINFORCING THE INGRESS PROTECTION OF THE VARIABLE SPEED DRIVE

TECHNICAL FIELD OF THE INVENTION

The present invention relates to a variable speed drive and a system including said variable speed drive and an architecture for reinforcing the ingress protection of the variable speed drive.

STATE OF THE ART

In the prior art, there are various solutions for creating an architecture to reinforce the ingress protection of a variable speed drive. They involve, for example, producing an architecture that is added onto the variable speed drive. Since the rear part of the variable speed drive which bears the heat sink must not be covered, the latter must intrinsically exhibit a certain level of ingress protection. On the other hand, it is necessary to ensure the ingress protection of the front part if the latter exhibits a more limited level of ingress protection, for example IP00 or IP20.

One solution is, for example, described in the patent FR2947692. In this patent, the variable speed drive is passed through an opening produced in a frame and a tight seal is placed between the variable speed drive and the edges of said opening. A seal-tight cover is then added onto the front part of the variable speed drive. The opening produced in the frame is chosen to be big enough to be able to pass the variable speed drive through the opening by applying a simple translational movement. However, this solution demands the use of a specific seal with which to fill, in a perfectly seal-tight manner, the space between the body of the variable speed drive and the edges of the opening produced in the frame. The fitting of the seal is not easy and the seal must have a specific shape to be able to ensure the desired ingress protection.

In another configuration, a seal is, for example, arranged against a flange produced on the front part of the variable speed drive. When the variable speed drive is inserted by translation through the opening produced in the frame, the seal is compressed between the flange and the area situated at the periphery of the opening. This solution makes it possible to avoid the use of a specific seal but does make it necessary to dimension the opening produced in the frame so that its outline follows the flange produced on the variable speed drive. Now, the rear part of the variable speed drive has fixing tabs situated at the rear of the variable speed drive, these fixing tabs including, for example, drilled holes making it possible to fix the variable speed drive on a support. To access these fixing tabs, the front part and the rear part of the variable speed drive are formed in such a way as to have passages making it possible to access, from the front of the variable speed drive, the fixing tabs situated at the rear. The presence of these fixing tabs means that it is no longer possible to insert the variable speed drive through the opening produced in the frame, the opening not being big enough. In the prior art, it has been proposed to produce removable fixing tabs, which are removed when the variable speed drive is installed in the frame. However, this complicates the manufacture of the rear part of the variable speed drive and it does not make it possible to propose a monoblock rear part, that is to say produced as a single piece.

The aim of the invention is to propose a variable speed drive that can be inserted through the opening produced on the frame, while having non-removable fixing tabs that stand salient in the fixing plane of the variable speed drive relative to the projection of the flange in this plane.

EXPLANATION OF THE INVENTION

This aim is achieved by a variable speed drive intended to control an electrical load, said variable speed drive being constructed to be inserted along a main axis through an opening produced in a frame and comprising a front part suitable for supporting a control interface and a rear part assembled on the front part, the front part forming a flange relative to the rear part, said rear part comprising a main body having a cross section with an outer shape constructed to closely fit the inner perimeter of the opening, and a fixing plinth extending the main body towards the rear, said fixing plinth comprising a plurality of fixing tabs, making it possible to fix the variable speed drive on a support, the front part and the rear part of the variable speed drive being formed in such a way as to have passages to access, from the front of the variable speed drive, each fixing tab situated at the rear, said passages being produced parallel to the main axis, the variable speed drive comprising an undercut produced on the main body of the rear part, having a sufficient depth to allow the fixing plinth to pass through said opening.

According to a particular feature, the undercut takes the form of a slot produced on a face of the variable speed drive.

The invention relates to a control system comprising a variable speed drive and an architecture for reinforcing the ingress protection of the variable speed drive, said architecture comprising a frame having an opening intended to accommodate the variable speed drive, the variable speed drive conforming to that defined above.

According to a particular feature of the system, the frame has a rectangular cross section forming a front plate through which the opening is produced in order to produce a mounting and two side plates, the section being interrupted in the longitudinal direction on its rear side so as to form two non-contiguous rear plates each situated in the extension of a side plate.

According to another particular feature, the variable speed drive is constructed in the frame in such a way that its front part emerges from the frame relative to a plane formed by the front plate.

According to another particular feature, the architecture comprises a cover intended to cover the front part of the variable speed drive.

According to another particular feature, the cover is produced in two parts.

According to another particular feature, the seal-tight architecture comprises a gasket compressed between the flange and an area situated at the periphery of the opening of the frame.

The invention finally relates to a method for mounting a variable speed drive, as defined above, in a frame comprising an opening, the method comprising the following steps:

insertion of the undercut in an edge of the opening to make the top fixing tabs pass through by tilting the variable speed drive relative to the frame, rotation of the variable speed drive towards the interior of the opening to bring it in the direction of the main axis and make the bottom fixing tabs pass through, translation of the variable speed drive in a plane perpendicular to the main axis to disengage the undercut from the edge of the opening, translation of the variable speed drive along the main axis so as to drive it in until the flange bears against an area situated at the periphery of the opening produced through the frame.

BRIEF DESCRIPTION OF THE FIGURES

Other features and advantages will emerge from the following detailed description, given in light of the appended drawings in which.

DETAILED DESCRIPTION OF AT LEAST ONE EMBODIMENT

The invention applies to a variable speed drive 1 preferentially having an architecture in two parts assembled together, one part, called front part, intended to house the control/command elements and one part, called rear part, intended to house the power components.

Hereinafter in the description, we define a main axis (X) by the front-rear direction of the variable speed drive.

The terms "top" and "bottom" should be understood by taking the main axis (X) as reference when the latter is horizontal.

Figure 1:
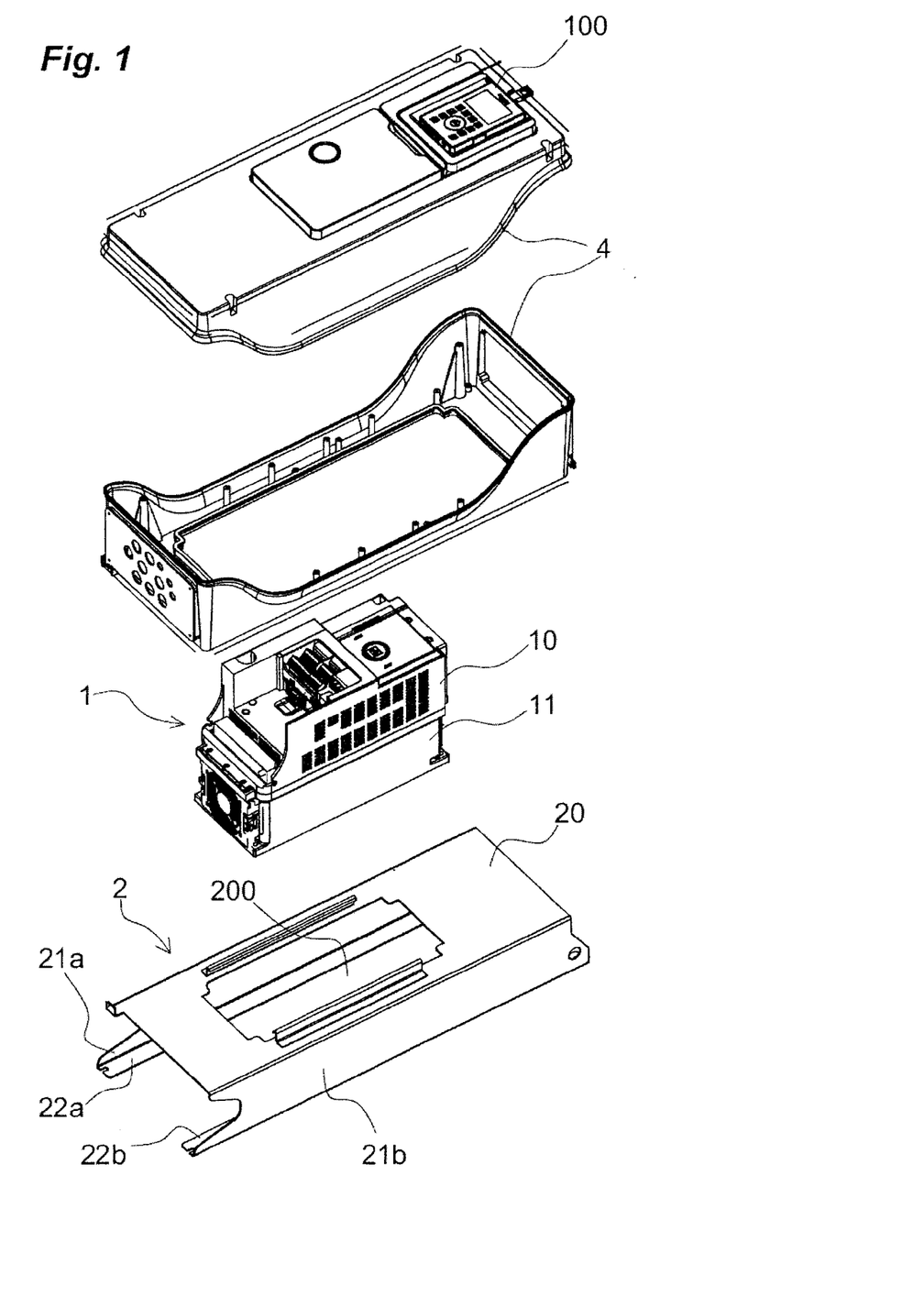
FIG. 1 represents the complete system of the invention, including the variable speed drive and the architecture making it possible to reinforce its ingress protection.

The front part 10 comprises a first housing enclosing control electronic circuit boards intended to control an electrical load and is suitable for supporting a control interface, that is to say a keyboard and/or a screen, for example taking the form of a detachable remote control 100, that can be transferred to the front of the seal-tight architecture (FIG. 1).

The rear part 11 comprises a second housing assembled on the first housing of the front part 10 and including the power electronic modules, the bus capacitor and fan and heat dissipation means.

Figure 2A:
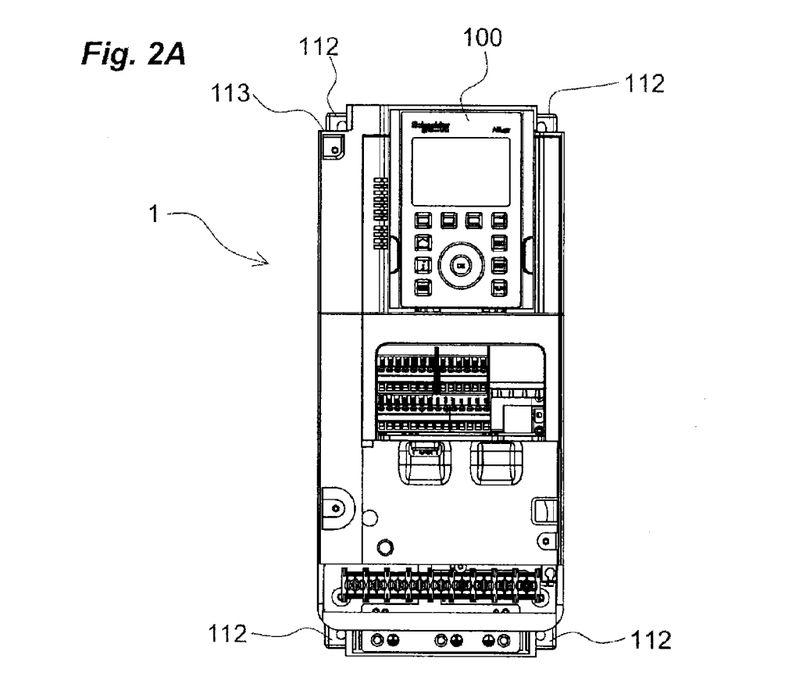
FIGS. 2A and 2B represent a variable speed drive, respectively seen from the front and seen from below.
Figure 2B:
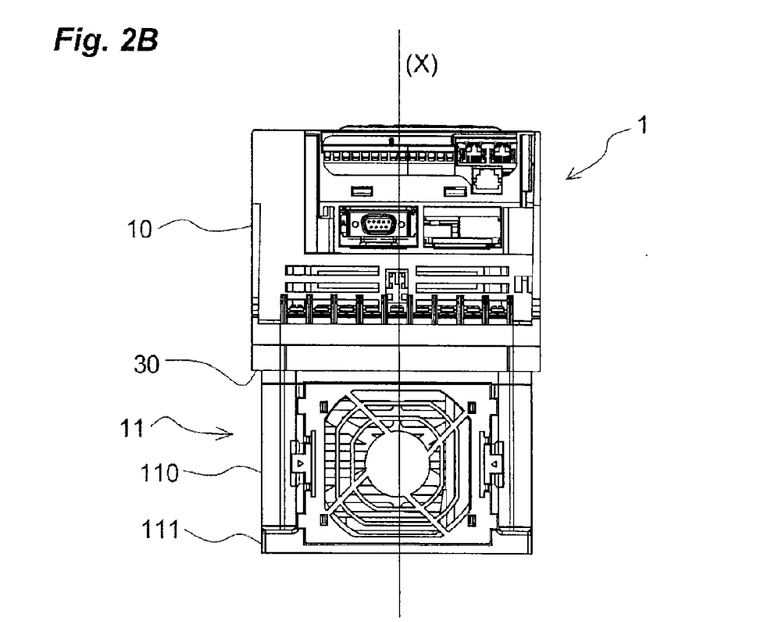

The variable speed drive has a generally parallelepipedal form. The variable speed drive comprises a flange 30 (FIG. 2B) produced at the junction between the front part 10 and the rear part 11, said flange 30 being arranged to serve as bearing surface for a gasket, said bearing surface being produced in a plane perpendicular to the main axis (X). The flange 30 is produced over the entire perimeter of the variable speed drive.

The rear part 11 comprises a main body 110 situated at the very front and a fixing plinth 111 situated at the rear of said main body. The fixing plinth 111 is employed to fix the variable speed drive 1 on a support. It comprises a number of fixing tabs 112 (FIG. 2A), for example one at each corner, each provided with a drilled hole. The fixing tabs 112 are produced in a plane, called fixing plane, perpendicular to the main axis (X), and stand salient in this fixing plane relative to the projection of the flange produced in said plane. The variable speed drive 1 in fact comprises passages 113 produced parallel to the main axis (X) allowing access, from the front of the variable speed drive 1, to the fixing tabs 112 situated at the rear of the variable speed drive. These passages 113 are produced over the entire depth of the variable speed drive.

The seal-tight architecture is employed to reinforce the ingress protection of the front part 10 of the variable speed drive. The architecture of the invention makes it possible, for example, to obtain a variable speed drive that has an ingress protection level of IP55. Obviously, to obtain an ingress protection level of IP55, it is necessary for the rear part 11 of the variable speed drive to be intrinsically at this ingress protection level IP55. The front part 10 of the variable speed drive, which is initially at a low ingress protection level (IP20 or IP00), is then reinforced by virtue of a seal-tight architecture to obtain an ingress protection level of IP55.

The architecture of the invention consists mainly of a frame 2 having a suitable design, a gasket 3 to ensure the ingress protection between the variable speed drive 1 and the frame 2, and more specifically of the front part 10 of the variable speed drive on the frame 2 and of a seal-tight cover 4 intended to cover the front part 10 of the variable speed drive 1 and, for example, produced in two parts.

According to the invention, the frame 2 is, for example, produced in a metal material and has a rectangular cross section interrupted on one of its sides in the longitudinal direction. Thus, the frame comprises a front main plate 20, two side plates 21a, 21b perpendicular to the front plate 20 and two non-contiguous rear plates 22a, 22b situated in one and the same plane, parallel to the plane of the front plate 20.

The front plate 20 has an opening 200 so as to form a metal mounting. The opening 200 is produced in such a way as to closely fit the shape of the main body 110 of the rear part, upon an axial translation of the variable speed drive through the opening 200. This opening 200 therefore closely fits notably the outlines forming the passages 113 for accessing the fixing tabs 112. The opening 200 is not therefore rectangular in as much as it includes, at its four corners, a cutout that closely fits the shape of the variable speed drive at the level of the passages 113 for accessing the fixing tabs 112.

The variable speed drive 1 is intended to be inserted, in an axial direction, through the opening 200 produced in the front plate 20 of the frame 2. The front part 10 of the variable speed drive 1 emerges from the frame relative to the plane formed by the front plate 20 of the frame. The variable speed drive 1 is positioned in such a way as to have side, top and bottom faces, parallel to the axis of the opening 200 and therefore perpendicular to the plane formed by the front and rear plates of the frame 2.

According to the invention, the opening 200 produced in the frame is dimensioned so that the area situated at the periphery of said opening 200 bears against the bearing surface formed by the flange 30 produced on the variable speed drive. A gasket is thus positioned between said flange and the area situated at the periphery of the opening produced in the frame. The opening 200 of the frame is produced in such a way as to closely fit the outer shape of the main body 110 of the rear part 11 of the variable speed drive.

As described previously, the fixing tabs 112 stand salient in the fixing plane relative to the projections of the main body 110 of the rear part 11 and of the flange 30 in this plane. The fitting of the variable speed drive 1 through the opening 200 of the frame 2 as far as the abutment formed by the flange 30 is enabled by virtue of an undercut 40 produced on the main body 110 of the rear part 11. This undercut 40 is constructed to make it possible for the fixing plinth 111, and therefore for the fixing tabs 112, to be passed through the opening 200 of the frame 2. The undercut 40 for example takes the form of a slot produced on the top or bottom surface of the rear part 11, just in front of the fixing tabs 112, in a plane parallel to the fixing plane. It is constructed to receive an edge of the opening 200.

Figure 3:
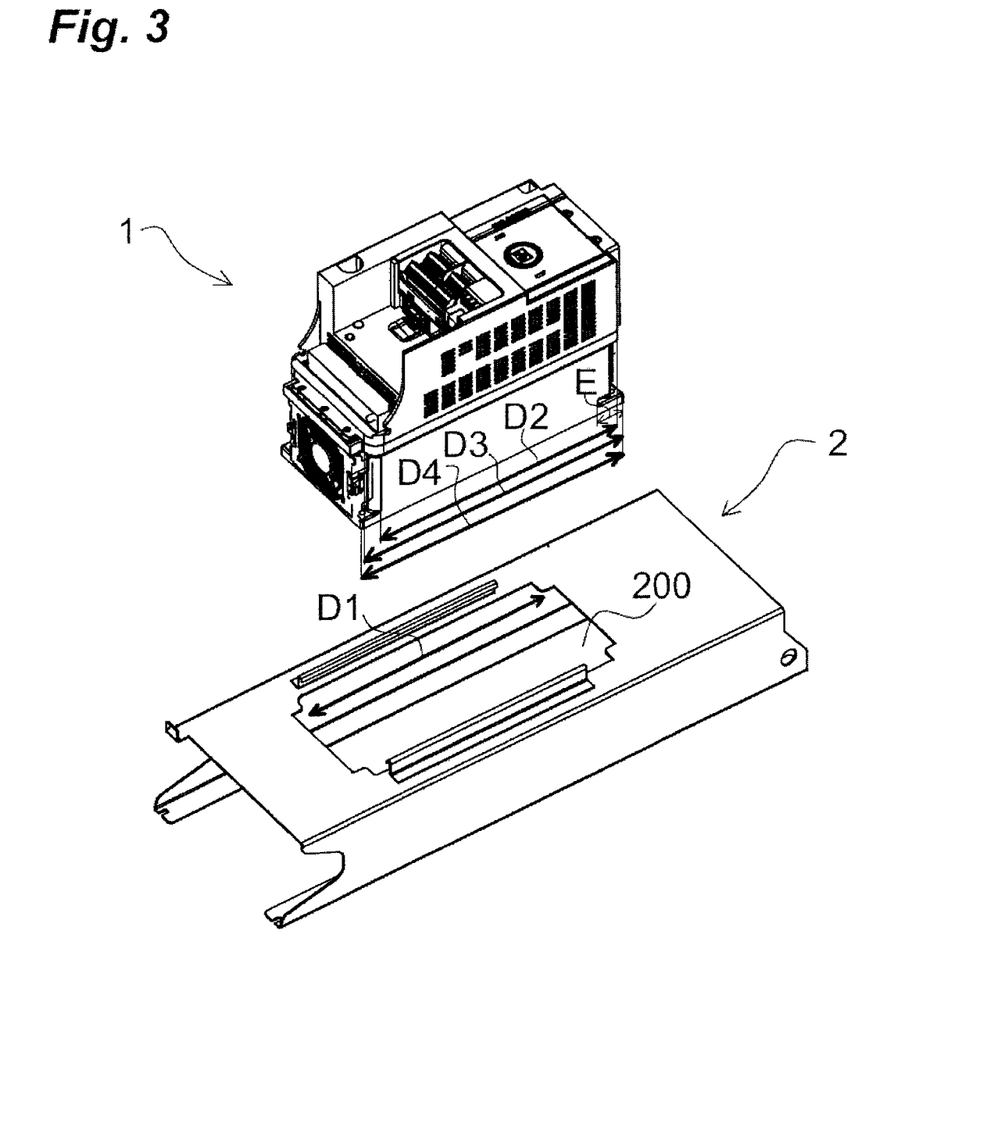
FIG. 3 represents, in perspective, the variable speed drive to be installed in the frame.

In FIG. 3, the following various parameters are defined:

D1 corresponds to the distance between two parallel opposite edges of the opening 200.

D2 corresponds to the distance between the parallel top edge and bottom edge of the flange 30.

D3 represents the distance between the top face and the bottom face of the variable speed drive 1, at the level of the main body 110 of the rear part.

D4 represents the distance between the parallel top edge and bottom edge of the fixing plinth 111.

E represents the depth of the slot produced on the variable speed drive 1.

In order to make it possible to insert the variable speed drive 1 through the opening 200 of the frame 2, the following constraints must thus be observed:

D2>D1 to apply the flange 30 against the area situated at the periphery of the opening 200.

D3<D1 to be able to fit the variable speed drive 1 through the opening 200.

D4>D1 which prevents the translation of the variable speed drive through the opening.

D4−E<D1 which allows the fixing plinth to pass through the opening.

FIGS. 4A to 7B illustrate the fitting of the variable speed drive 1 on the frame 2.

Figure 4A:
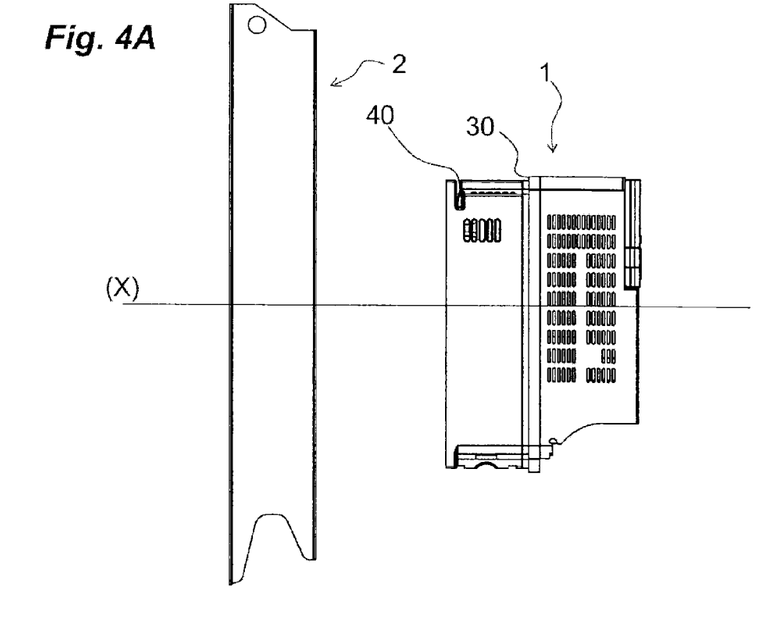
FIGS. 4A and 4B illustrate the first step in fitting the variable speed drive on its frame.
Figure 4B:
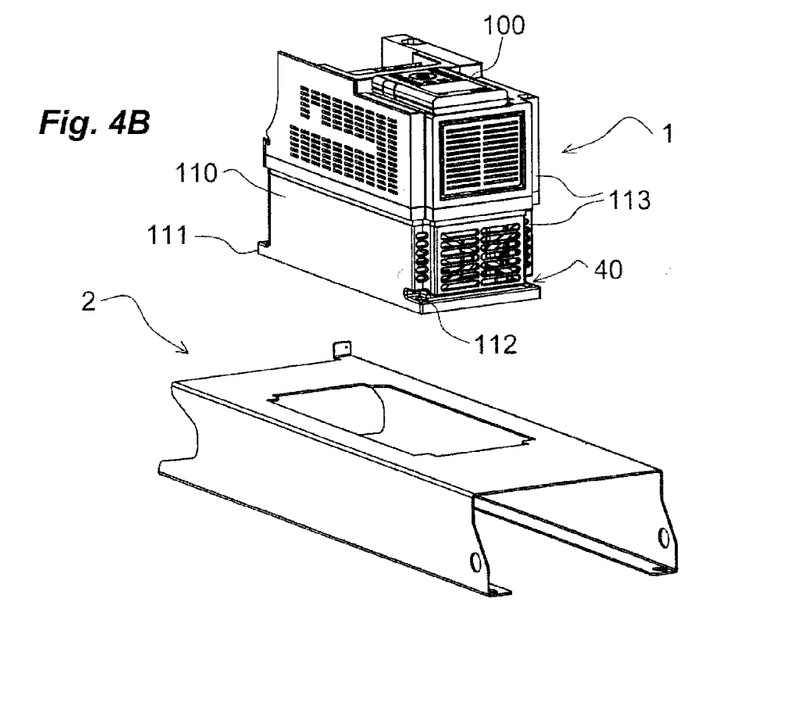

In FIGS. 4A and 4B, the top edge of the opening 200 is engaged in the undercut 40 by slightly tilting the variable speed drive 1 relative to the fixing plane, thus allowing for the passage of the top fixing tabs.

Figure 5A:
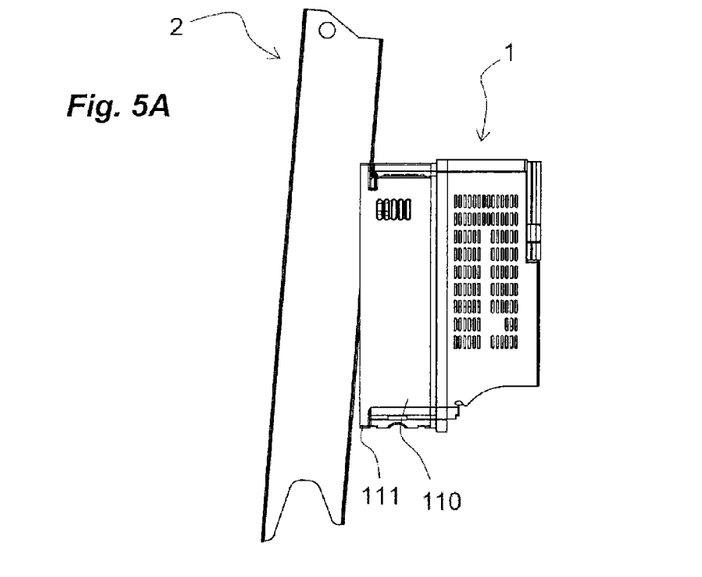
FIGS. 5A and 5B illustrate the second step in fitting the variable speed drive on its frame.
Figure 5B:
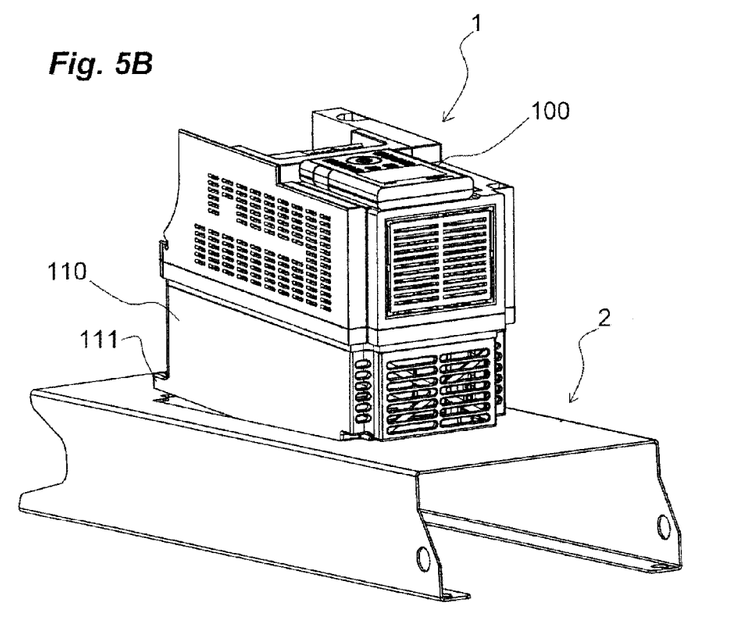

In FIGS. 5A and 5B, the variable speed drive is brought into the fixing plane for the bottom fixing tabs to pass.

Figure 6A:
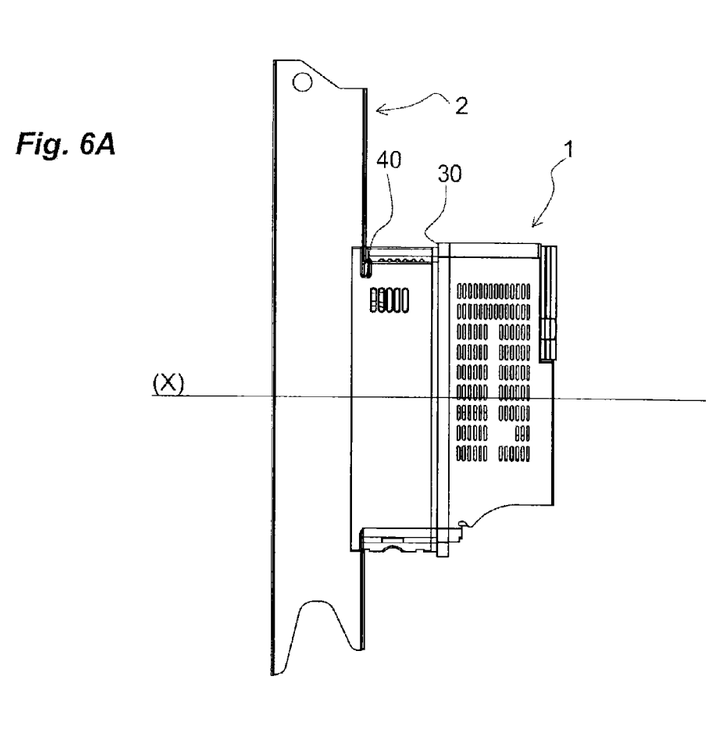
FIGS. 6A and 6B illustrate the third step in fitting the variable speed drive on its frame.
Figure 6B:
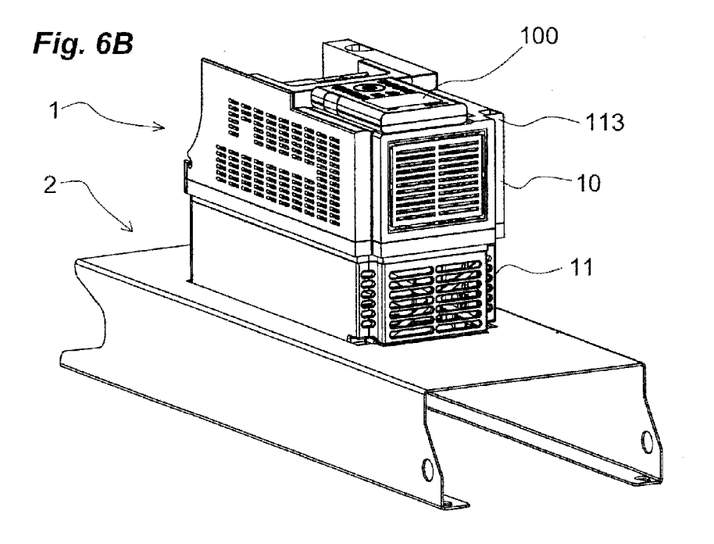

In FIGS. 6A and 6B, the variable speed drive is translated downwards, making it possible to disengage the top edge of the opening from the slot. The bottom edge of the opening 200 then bears against the bottom face of the main body 110 of the rear part 11.

Figure 7A:
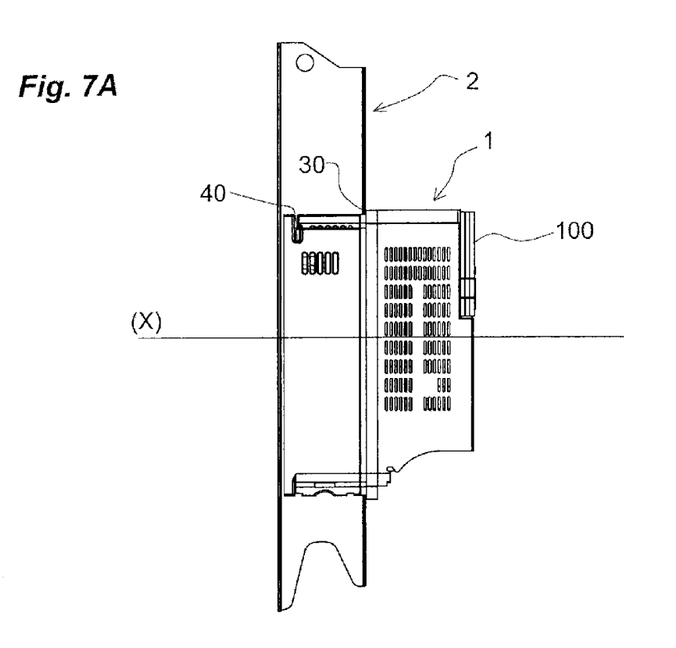
FIGS. 7A and 7B illustrate the fourth step in fitting the variable speed drive on its frame.
Figure 7B:
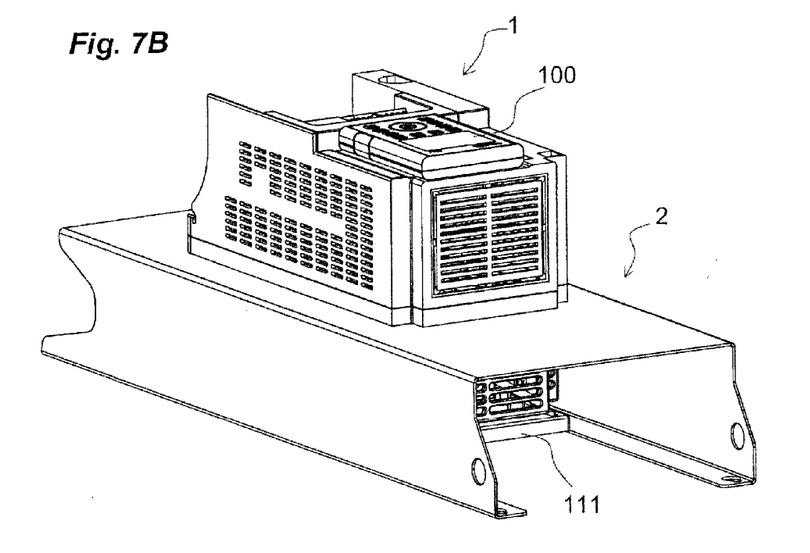

In FIGS. 7A and 7B, the variable speed drive 1 is pushed through the frame 2 in a translational movement produced along the main axis, until the flange 30 abuts against the area situated at the periphery of the opening 200, thus compressing the gasket.

The invention thus makes it possible to propose a solution that is easy to install, that makes it possible to obtain a satisfactory ingress protection, without affecting the structure of the variable speed drive. The variable speed drive notably has a simple configuration consisting of two main parts assembled together, the housing of the rear part 110 being produced in a single piece.

The invention claimed is:

1. A variable speed drive to control an electrical load, said variable speed drive being insertable along a main axis through an opening produced in a frame and comprising:
    a front part supporting a control interface; and
    a rear part assembled on the front part,
    wherein the front part forms a flange relative to the rear part, said rear part includes
        a main body having a cross section with an outer shape closely fitting an inner perimeter of the opening, and
        a fixing plinth extending the main body towards a rear, said fixing plinth including a plurality of fixing tabs fixing the variable speed drive on a support,
    the front part and the rear part of the variable speed drive are formed to have passages to access, from a front of the variable speed drive, each fixing tab situated at the rear, said passages are produced parallel to the main axis, and the variable speed drive includes an undercut produced on the main body of the rear part, having a sufficient depth to allow the fixing plinth to pass through said opening.

2. The variable speed drive according to claim 1, wherein the undercut takes the form of a slot produced on a face of the variable speed drive.

3. A control system comprising
    the variable speed drive according to claim 1, and
    an architecture for reinforcing ingress protection of the variable speed drive, said architecture comprising the frame having the opening accommodating the variable speed drive.

4. The control system according to claim 3, wherein the frame has a rectangular cross section forming a front plate through which the opening is produced in order to produce a mounting and two side plates, the section being interrupted in the longitudinal direction on a rear side to form two non-contiguous rear plates each situated in an extension of a side plate.

5. The control system according to claim 4, wherein the variable speed drive is constructed in the frame in such a way that the front part emerges from the frame relative to a plane formed by the front plate.

6. The control system according to claim 3, wherein the architecture comprises a cover to cover the front part of the variable speed drive.

7. The control system according to claim 6, wherein the cover is produced in two parts.

8. The control system according to claim 7, wherein the architecture being seal-tight and comprises a gasket compressed between the flange and an area situated at a periphery of the opening of the frame.

9. The variable speed drive according to claim 1, wherein a cross-sectional area of the main body corresponding to a bottom surface of the main body is greater that an area of the opening.

10. A method for mounting a variable speed drive to control an electrical load, said variable speed drive being insertable along a main axis through an opening produced in a frame and including a front part supporting a control interface, and a rear part assembled on the front part, wherein the front part forms a flange relative to the rear part, said rear part includes a main body having a cross section with an outer shape closely fitting an inner perimeter of the opening, and a fixing plinth extending the main body towards a rear, said fixing plinth including a plurality of fixing tabs fixing the variable speed drive on a support, the front part and the rear part of the variable speed drive are formed to have passages to access, from a front of the variable speed drive, each fixing tab situated at the rear, said passages are produced parallel to the main axis, and the variable speed drive includes an undercut produced on the main body of the rear part, having a sufficient depth to allow the fixing plinth to pass through said opening, in a frame including an opening, the method comprising:
    inserting the undercut in an edge of the opening to make top fixing tabs pass through by tilting the variable speed drive relative to the frame;
    rotating the variable speed drive towards an interior of the opening to bring the variable speed drive in the direction of the main axis and make bottom fixing tabs pass through;
    translating the variable speed drive in a plane perpendicular to the main axis to disengage the undercut from the edge of the opening;
    translating the variable speed drive along the main axis to drive the variable speed drive in until the flange bears against an area situated at a periphery of the opening produced through the frame.

* * * * *